United States Patent [19]
Hamard

[11] Patent Number: 5,901,028
[45] Date of Patent: May 4, 1999

[54] ELECTRICITY METER PROVIDED WITH A SYSTEM FOR PROTECTION AGAINST SURGES

[75] Inventor: Guillaume Hamard, Paris, France

[73] Assignee: Schlumberger Industries, S.A., Montrouge Cedex, France

[21] Appl. No.: 09/098,365

[22] Filed: Jun. 17, 1998

[30] Foreign Application Priority Data

Jul. 1, 1997 [FR] France ................................ 9708388

[51] Int. Cl.⁶ .................................................. H02H 1/00
[52] U.S. Cl. ........................... 361/129; 361/111; 361/117
[58] Field of Search .............................. 361/111, 91, 117, 361/119, 120, 129, 127

[56] References Cited

U.S. PATENT DOCUMENTS 4,365,282  12/1982  Brainard ................................... 361/127
5,282,108  1/1994  Munday et al. ......................... 361/117

*Primary Examiner*—Sally C. Medley
*Attorney, Agent, or Firm*—Leonard W. Pojunas

[57] ABSTRACT

At least one live conductor and one neutral strap are provided for an electricity meter, the respective inlets and outlets of the live conductor and of the neutral strap being disposed inside the meter housing parallel to one another and being coplanar. A metal bar connected to neutral is disposed inside the meter housing in the vicinity of and at a short distance from the inlet and/or the outlet of the live conductor to define a gap in which a controlled arc between the live conductor and the metal bar can propagate in the event of a surge.

9 Claims, 4 Drawing Sheets

ELECTRICITY METER PROVIDED WITH A SYSTEM FOR PROTECTION AGAINST SURGES

The present invention relates to an electricity meter comprising at least one live conductor and one neutral strap, the respective inlets and outlets of the live conductor and of the neutral strap being disposed in the meter housing parallel to one another and being coplanar.

BACKGROUND OF THE INVENTION

This disposition of live conductors and of the neutral in the housing is typical for electricity meters of the kind used, for example, on the European market. A sudden change in current on the grid can give rise to a surge on one of its phases. If the surge is large enough, the surrounding air becomes ionized, thus becoming conductive, and an electric arc is struck between one of the phases and neutral. The very high energy of the arc, as maintained by the electricity mains, heats the air and can cause the housing to explode. This risk increases with increasing volume of air that is heated.

In conventional meters, the problem of a surge on one of the live phases is often handled by using a varistor between the phase and neutral, the varistor being placed at the inlet to the meter so as to protect its electronic circuits. Below a predetermined threshold voltage, the varistor is normally non-conductive. If the voltage exceeds the threshold, then the varistor becomes conductive and the surge is diverted to neutral.

An example of another protection system of that type is given in U.S. Pat. No. 5,282,108. Each live inlet is connected via a cable to an electrode located immediately above a metal plate which is grounded via a resistor in the form of a block. In the event of a surge, the current between the electrode and the plate is conducted to ground via the resistor.

OBJECTS AND SUMMARY OF THE INVENTION

The main object of that protection system is to protect the electronic components against the effects of voltage surges. The connection circuit between one of the phases and ground (a cable, a pair of electrodes, a resistor) is relatively complex. In the event of one of those components being faulty, the meter will have no protection against a large variation in current and an arc may be struck.

Similarly, in protection circuits provided with one or more varistors, varistor aging can make the circuit ineffective so that a violent surge can strike an arc between one of the phases and neutral, or even between two of the phases, with the consequences described above.

Thus, one of the objects of the present invention is to overcome the problems associated with known devices so as to provide a protection system that prevents an uncontrolled arc being created, even in the event of a protection circuit against surges that is normally present in the meter failing.

An electricity meter of the present invention includes a metal bar connected to neutral and disposed inside the meter housing in the vicinity of and at a short distance from the inlet and/or the outlet of the live conductor to define a gap in which a controlled arc between the live conductor and the metal bar can propagate in the event of a surge.

Thus, in the event of failure (or even absence) of another protection circuit, the present invention prevents an uncontrolled arc being formed between the live conductor(s) and neutral inside the housing. The short distance between the live conductors and the neutral bar ensures that the volume of air heated by the controlled arc is insufficient to give rise to an explosion.

In an embodiment, the present invention applies to an electricity meter comprising a plurality of live conductors and a neutral strap, the inlets and outlets of the live conductors and of neutral being parallel to one another and being coplanar, the length of the bar being determined so that the inlets and/or outlets of all of the live conductors are directly in register with the bar.

The present invention can be applied to single phase meters, i.e. to meters that posses only one live conductor having its input and output on either side of the neutral strap. Nevertheless, the risk of an explosion due to an uncontrolled arc is higher for a multiphase meter since the disposition of a plurality of phases and neutral in parallel inside the housing means that at least one of the phases is relatively remote from neutral. An arc between said phase and neutral will therefore be much larger than the arc which could have occurred in a single phase meter. There can also be a problem of arcing between adjacent phases within a three phase meter.

The specific and exact shape of the bar covering the live conductors can vary; it may be curved or it may merely be rectilinear with an L-shape. Preferably, an improved shape is selected for an L-shaped bar having projecting portions which descend to a distance that is very close to each of the phases, which projecting portions have bases that are curved so as to adapt to the cylindrical shape of the live conductors.

The bar connected to neural is preferably placed inside the housing perpendicularly to and above the phases and the base of the housing.

The bar may be connected to mains neutral via a neural strap connection that is formed separately from the neutral bar. Nevertheless, in a preferred embodiment, the bar and the neutral strap of the meter are constituted by a single piece of metal. This solution evolves any problem of poor connection between the peak limiter and neutral, and reduces the cost of the device.

In an embodiment, the material selected for the bar is copper. This material withstands the effects of an arc very well and can deliver a high current for a relatively long period of time.

The present invention can be applied to meters having no other means for providing protection against surges. Nevertheless, it is preferable for the meter also to have one or more varistors connected between neutral and the inlet of each live conductor.

By using a set of varistors at the inlet of the meter, the circuits of the meter are protected against the effects of a mains surge. The operation of the two protection systems is generally complementary and the protection system of the invention will be used only in the event of one of the varistors failing or in the event of a surge that is too great to be absorbed by the varistors. Although it is possible to replace the conventional system by means of a meter inlet bar very close to the live conductors so as to accommodate each small surge by creating a controlled arc between a phase and the bar, such use would be relatively inappropriate given that it is always preferable to avoid striking any arc at all inside the housing.

The bar is preferably located close to and at a small distance from the outlet of each live conductor of the meter.

Other embodiments are possible, for example embodiments in which the bar extends over the live conductors where they enter into the meter or over the inlet and the outlet of each conductor. Nevertheless, as described above, it is preferable for the system of the invention to come into use only in the event of a normal protection circuit failing. Placing the bar at the inlet of the meter increases the risk that the system of the invention will operate before or simultaneously with the varistors in such a circuit.

BRIEF DESCRIPTION OF THE DRAWINGS

The invention will be better understood on reading the following description of an embodiment thereof which is given by way of non-limiting illustration and which refers to the accompanying drawings, in which.

MORE DETAILED DESCRIPTION

Figure 1:
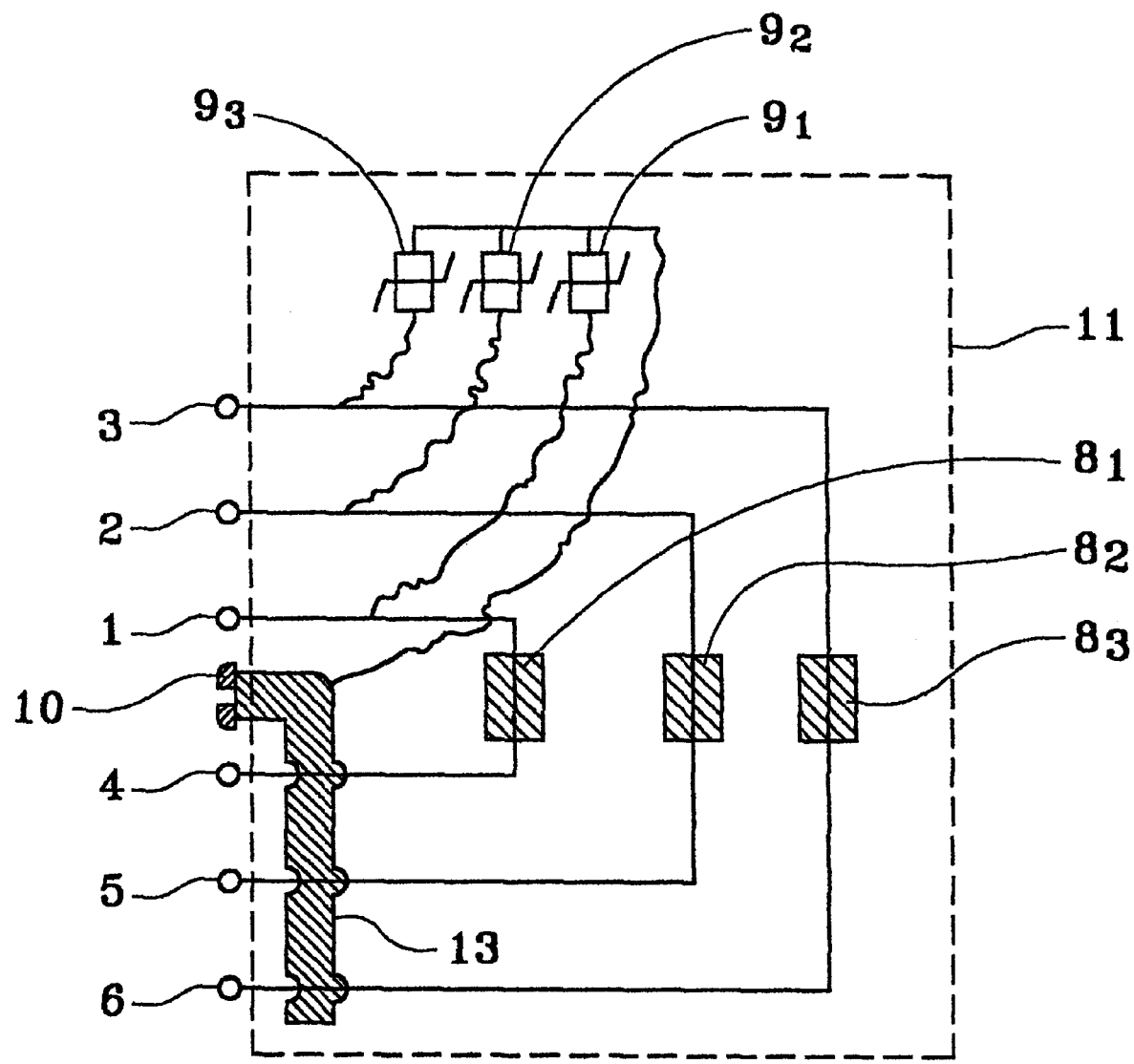
FIG. 1 is an equivalent electrical circuit for a three-phase meter provided with a protection system of the invention.

The meter whose electrical circuit is given by FIG. 1 is a meter of the three-phase type. It is connected to mains via three inlets for live phase conductors 1, 2, and 3, to a load circuit via outlets for three live phase conductors 4, 5, and 6, and to neutral via a neutral strap 10. The neutral strap 10 extends from a bar 13 and constitutes a single piece 7. The inlet conductors 1, 2, and 3 are coplanar and penetrate into the housing 11 in parallel. Similarly the three outlet conductors 4, 5, and 6 are coplanar and parallel. Power metering is performed by means of current sensors $8_1$, $8_2$, and $8_3$ each connected to one of the phases between the mains and the user. The meter also has voltage sensors and electrical circuits for calculating power. These components are standard and are not described in detail. Three varistors $9_1$, $9_2$, and $9_3$ are connected each between a respective one of the live phases and neutral, thereby constituting a first safety system against surges. Any surge on any one of the phases will normally be dumped to neutral via the corresponding varistor which is made conductive if the level of the surge voltage exceeds the threshold of the varistor.

Figure 2:
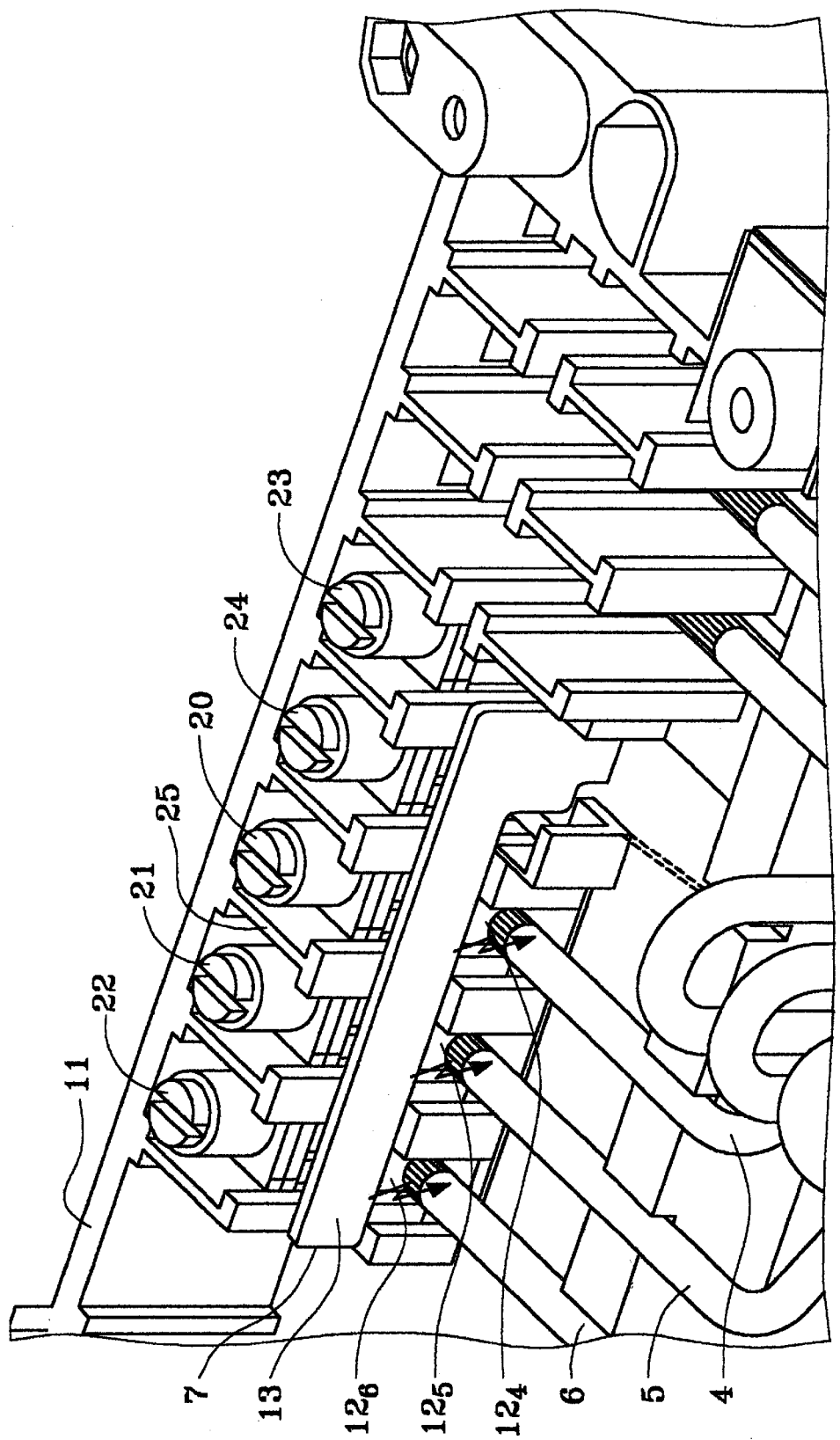
FIG. 2 shows the outlets of the live conductors in a three-phase meter in which there is located a bar connected to neutral in accordance with the system of the invention.

FIG. 2 shows in detail the live (or phase) conductors 4, 5, and 6 and the piece 7 which is connected to neutral. An overall view of the piece 7 is given in FIG. 3. It comprises an L-shaped bar 13 together with a neutral strap 10 that is U-shaped. As shown in FIG. 2, the bar 13 directly overlies all three live conductors 4, 5, and 6. More precisely, it extends perpendicularly over the three live conductors and it does so in equivalent manner for each of them. Small-sized gaps $12_4$, $12_5$, and $12_6$ are thus left between the bar 13 and each of the live conductors.

Figure 3:
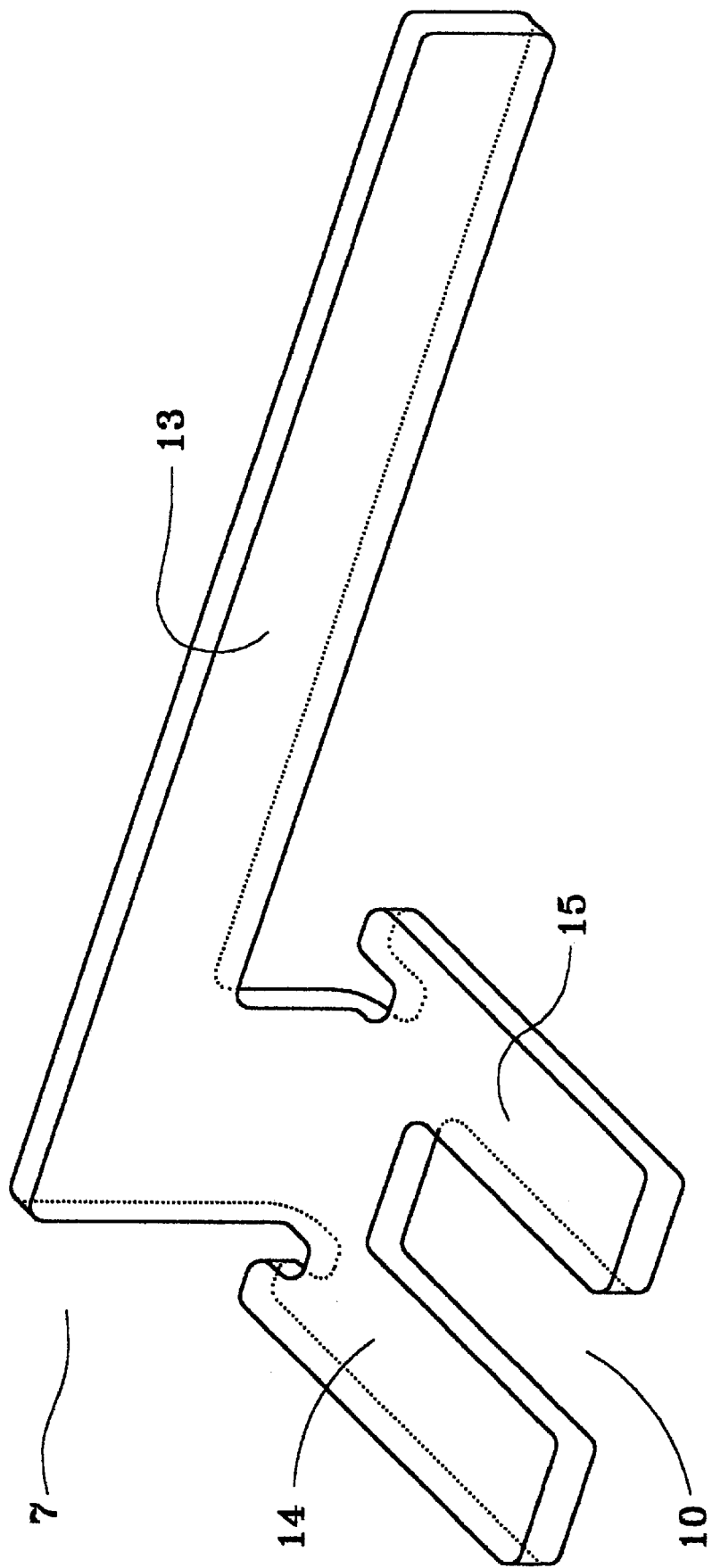
FIG. 3 shows the bar of FIG. 2 in detail.
Figure 4:
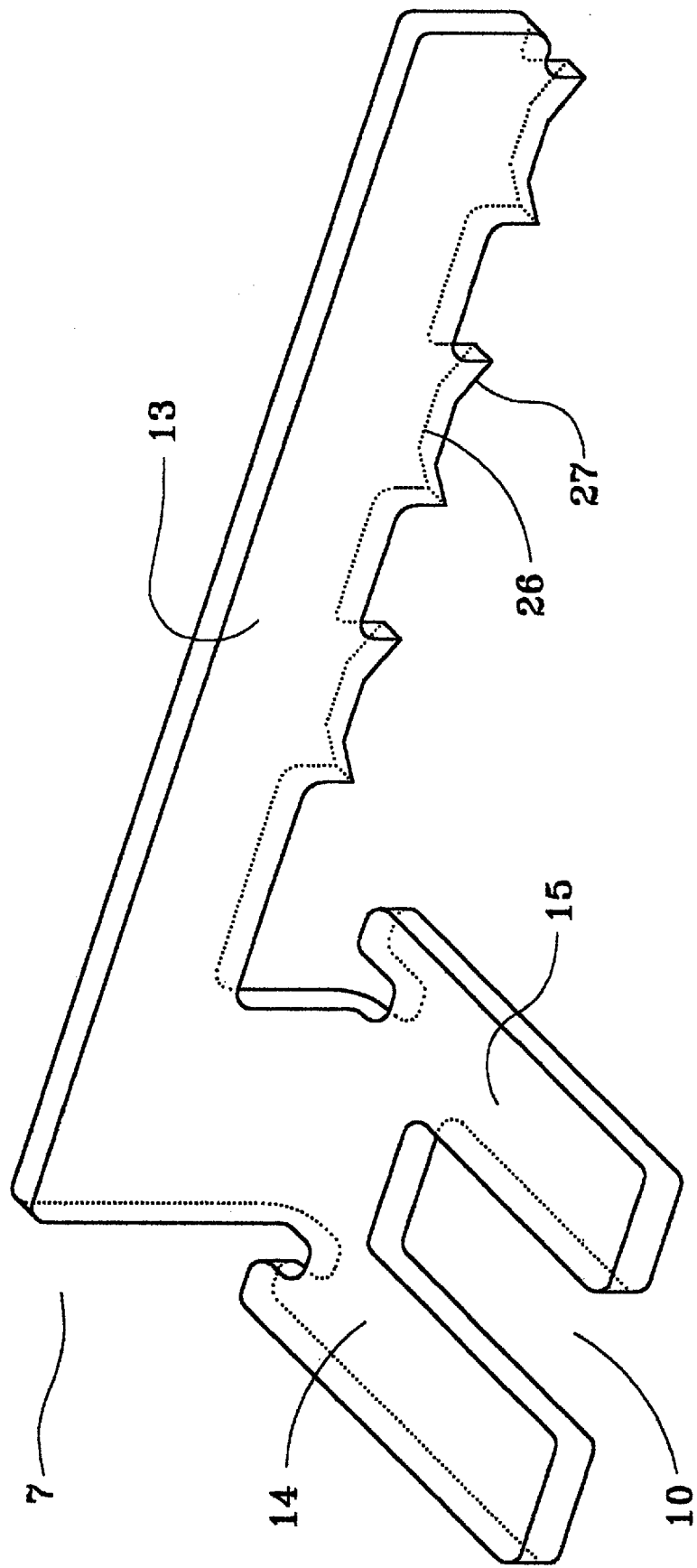
FIG. 4 show an improved shape for the bar of FIG. 3.

FIG. 4 shows an improved shape for the bar 13 shown in FIG. 3. The bar 13 is provided with projecting portions 26 which come down very close to each of the live conductors 4, 5, and 6. The bases 27 of these portions 26 are curved so as to fit as closely possible around the cylindrical shape of the live conductors.

The safety system constituted by the varistors and described above can sometimes fail: varistors age and then become ineffective in handling surges. The system formed by the set of three live conductors and the piece 7 which is connected to neutral thus constitutes an additional system for providing protection against surges. In the event of a varistor failing and in the presence of a potentially dangerous surge, the air in the gap $12_4$, $12_5$ or $12_6$ becomes ionized, and thus becomes conductive, with the result that a controlled arc is struck between the phase 4, 5, or 6 and the bar 13 which is connected to neutral.

Typically, the electrical installation in which the meter is located has a set of fuses upstream from the meter making it possible, in the event of high currents, to open a circuit and interrupt the current flowing thereon. The arc current flowing through the circuit between one of the phases 4, 5, and 6 and the neutral bar 13 will normally be sufficient to blow one of the fuses and interrupt the current. By these means, the present invention makes it possible for the meter to handle an arc formed between one of the phases and neutral without running the risk of the housing exploding, and to enable this to continue until a safety component external to the meter has had time to react to interrupt the current flowing through the meter.

The piece 7 is connected to neutral via its end portion which is connected by two flat tabs 14 and 15 which together define the neutral strap 10. Contact is guaranteed by two screws 23 and 24 which clamp the two tabs 14 and 15 against the neutral conductors of the load circuit. Connection is established between the three outlet conductors 4, 5, and 6 and the three phases of the load circuit by means of three screws 20, 21, and 22. All of these connections are outside the housing 11 and are isolated from one another by partitions 25 of the housing 11. The peak limiter, i.e. the live conductors 4, 5, and 6 plus the bar 13, is located inside the housing 11.

I claim:

1. An electricity meter comprising a meter housing and at least one live conductor provided with an inlet and an outlet and one neutral strap provided with an inlet and an outlet, the respective inlets and outlets of the live conductor and of the neutral strap being disposed in the meter housing parallel to one another and being coplanar, the meter including a metal bar directly connected to the neutral strap and disposed inside the meter housing in the vicinity of and at a short distance from the inlet and/or the outlet of the live conductor to define a gap in which a controlled arc between the live conductor and the metal bar can propagate in the event of a surge.

2. An electricity meter according to claim 1, comprising a plurality of live conductors, the inlets and outlets of the live conductors and of the neutral strap being parallel to one another and being coplanar, the length of the bar being determined so that the inlets and/or outlets of all of the live conductors are directly in register with the bar.

3. An electricity meter according to claim 1, in which the bar which overlies the live conductors is L-shaped.

4. An electricity meter according to claim 3, the live conductors have a cylindrical shape and in which the L-shaped bar which overlies the live conductors has projecting portions which descend to a distance that is very close to each of the live conductors, which projecting portions have bases that are curved so as to adapt to the cylindrical shape of the live conductors.

5. An electricity meter according to claim 1, in which the housing having a base the bar is placed inside the housing perpendicularly to the live conductors and to the base of the housing.

6. An electricity meter according to claim 1, in which the bar and the neutral strap of the meter are constituted by a single piece of metal.

7. An electricity meter according to claim 1, in which the bar is made of copper.

8. An electricity meter according to claim 1, in which the meter also comprises one or more varistors respectively connected between the inlet of each live conductor and neutral strap.

9. An electricity meter according to claim 1, in which the bar is located close to and at a small distance from the outlet of each live conductor from the meter.

* * * * *